United States Patent

Nabatame et al.

[11] Patent Number: 5,849,670
[45] Date of Patent: Dec. 15, 1998

[54] THALLIUM GROUP SUPERCONDUCTING WIRE

[75] Inventors: Toshihide Nabatame, Hitachi; Junichi Kawashima; Izumi Hirabayashi, both of Nagoya; Yuh Shiobara, Chigasaki; Shoji Tanaka, Tokyo, all of Japan

[73] Assignees: Hitachi, Ltd.; International Superconductivity Technology Center, both of Tokyo, Japan

[21] Appl. No.: 572,748

[22] Filed: Dec. 14, 1995

[30] Foreign Application Priority Data

Dec. 19, 1994 [JP] Japan .................................. 6-314464

[51] Int. Cl.$^6$ .................................................. H01B 12/00
[52] U.S. Cl. ...................... 505/230; 505/231; 505/232; 505/239; 505/704; 505/705; 174/125.1; 428/373; 428/700; 428/701; 428/702; 428/930
[58] Field of Search ..................... 428/373, 379, 428/209, 210, 688, 689, 700, 701, 702, 930; 505/701, 230, 231, 232, 239, 704, 705; 174/125.1

[56] References Cited

U.S. PATENT DOCUMENTS 5,462,922  10/1995  Doi et al. .............................. 505/785

FOREIGN PATENT DOCUMENTS

| 0304061 | 2/1989 | European Pat. Off. . |
| 0 401 461 | 12/1990 | European Pat. Off. . |
| 0431782 | 6/1991 | European Pat. Off. . |
| 63-271816 | 11/1988 | Japan . |
| 5-12929 | 1/1993 | Japan . |

Primary Examiner—Marie Yamnitzky
Attorney, Agent, or Firm—Antonelli, Terry, Stout & Kraus, LLP

[57] ABSTRACT

In order to provide a crystal oriented high quality thallium group superconducting wire having a high critical current density, thallium group superconducting film is formed on oxide single crystal fiber having plane facets and polygonal cross section in the thallium group superconducting wire, wherein c-axis of the thallium group superconducting film is oriented perpendicularly, and a- and b-axis are oriented in parallel to the longitudinal direction of the above fiber, respectively, and resulting to obtain a high quality thallium group superconducting wire with Jc of $10^5$ A/cm$^2$ or more at 77K.

20 Claims, 3 Drawing Sheets

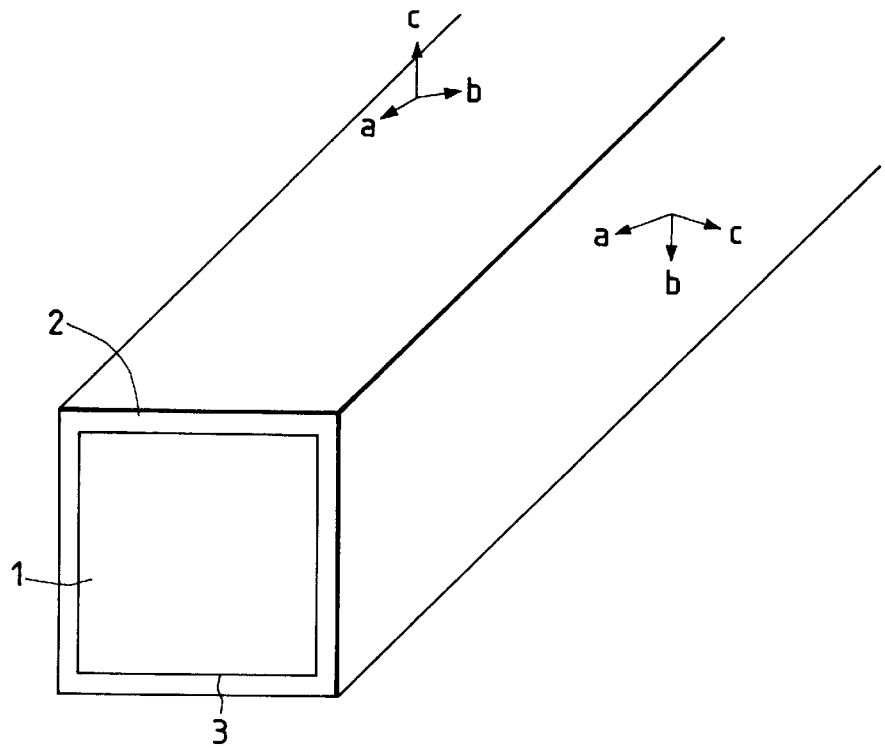
FIG. 1
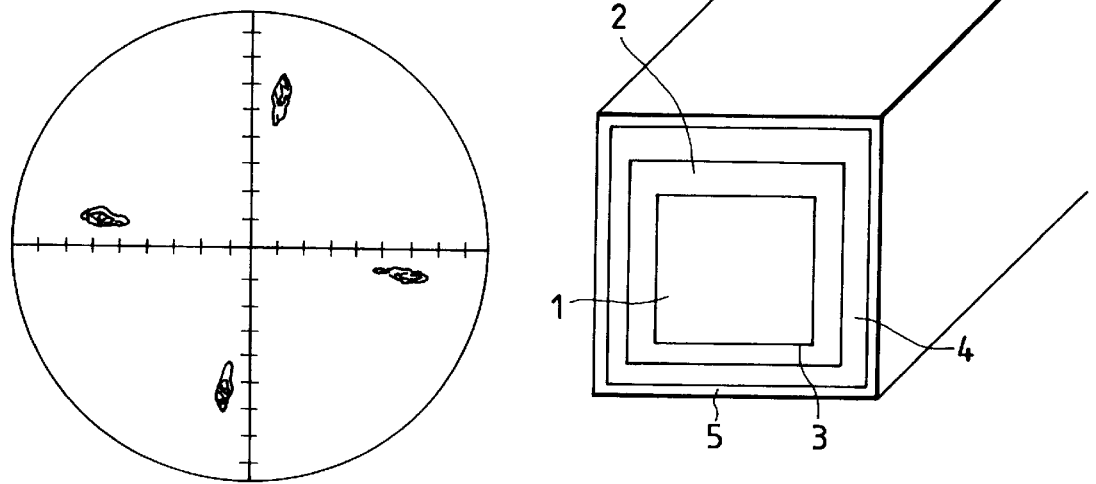
FIG. 2
FIG. 3

THALLIUM GROUP SUPERCONDUCTING WIRE

BACKGROUND OF THE INVENTION (1) Field of the Invention

The present invention relates to the thallium group superconducting wire.

(2) Description of the Prior Art

Since discovery of oxide superconductors with the critical temperature exceeding the boiling point (77 K.) of liquid nitrogen, there have been rising hopes for an effective use of superconductor phenomena in the field of superconducting magnet. Among them, the thallium group superconductor exhibiting the highest critical temperature of 127 K. is drawing a particular attention for its application. As a wire rod making technology to manufacture the superconducting magnet, there has been a known method of plastic processing after the powdered superconductor has been filled in the metallic pipe. The superconducting wire manufactured by this prior art method has insufficient crystal orientation; since it is polycrystalline, critical current density (Jc) undergoes an abrupt reduction at the crystalline boundary, failing to satisfy value Jc providing the area for practical use. Furthermore, there are superconducting wires which use oxides as substrates, in addition to those using said metals as substrates. For example, the method of forming an oxide group superconducting wire using the oxide as substrate is found in the method of forming a superconducting wire on the oxide single crystal fiber, as disclosed in Japanese Patent Laid-open NO.63-271816. There is also a method of laying out a third substance to improve crystal orientation inside the metal coated oxide superconductor, as disclosed in Japanese Patent Laid-open NO.5-12929(1993).

The prior art superconducting wire on the oxide single crystal fiber has the oxide single crystal fiber which is cylindrical in shape, resulting in insufficient crystal orientation of the superconducting wire formed on the cylinder. This has led to a poor connection on the conducting surfaces, accompanied by the problem of superconducting properties such as critical current density.

Furthermore, the superconducting film is not designed to allow the current to escape when superconducting properties are lost due to quenching and others. This has led to the difficulties in practical use and has restricted the scope of use. Furthermore, the latter approach provides improvement in crystal orientation of the superconductor close to the third substance, but produces random orientation of the majority of superconductors which are not in contact with the third substance, failing to provide a high critical current density.

SUMMARY OF THE INVENTION (1) Objects of the Invention

The object of the present invention is to solve the problems involved in the prior arts, and to provide a high quality thallium group superconducting wire featuring excellent crystal orientation and a high critical current density.

(2) Methods for Solving the Problems

The present inventors have solved above problems by forming, on oxide single crystal fiber of the thallium group superconducting wire having a polygonal form with plane facets, a c-axis perpendicularly oriented, and a- and b-axis in parallel oriented thallium group superconducting film to the longitudinal direction of the single crystal fiber. Also, the present inventors have solved above problems by coating said thallium group superconducting wire in the order of the conducting film and insulating film. Furthermore, the current capacity is greatly increased by the multi-core wire formed by bundling several thallium group superconducting wires.

By using the oxide single crystal fiber having plane facets, the present invention allows the c-axis perpendicularly oriented, and a- and b-axis in parallel oriented thallium group superconducting film to be formed to the longitudinal direction of the single crystal fiber. This will lead to excellent crystal orientation of the superconducting film and super connection of the conducting surfaces, thereby improving critical current density.

BRIEF DESCRIPTION OF THE DRAWINGS

FIG. 1 is a schematic drawing representing a thallium group superconducting wire according to the present invention, FIG. 2 is a pole figure representing a thallium group superconducting film obtained by the present invention, FIG. 3 is a schematic drawing representing a thallium group superconducting wire coated with conducting film and insulating film according to the present invention.

DESCRIPTION OF THE PREFERRED EMBODIMENT

Figure 4:
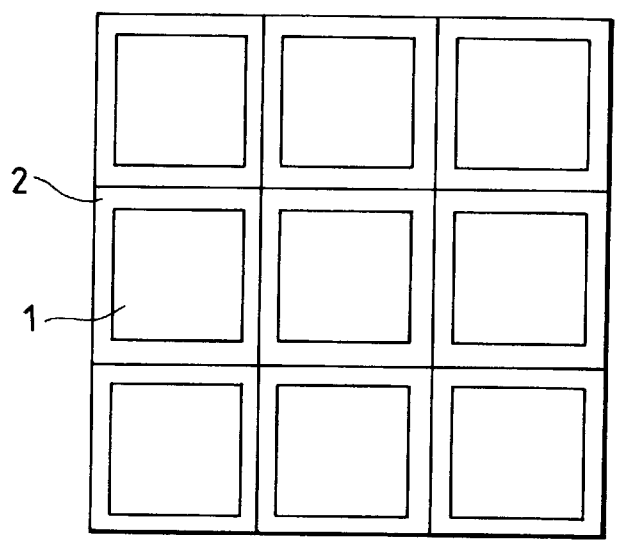
FIG. 4 is a schematic cross sectional view illustrating the thallium group superconducting multi-core wire according to the multi-core structure of the present invention.

The present invention is explained concretely based on the following illustrated embodiments.

Naphthenates of Ba, Ca and Cu were blended to get a composition ratio of $Ba_2Ca_2Cu_3O_y$, and toluene was added thereto to dissolve it, with the resulting solution used as starting solution. The $Y_2O_3$ single crystal plate having four plane facets containing (100) faces was dipped in said starting solution, to be coated at the speed of 1 mm per minute according to dip-coating method; then it was temporarily baked in the atmosphere at 500° C. for ten minutes. This coating and temporary baking process was repeated ten times to produce temporarily baked film Ba—Ca—Cu—O having a film thickness of about 1 microns. Then, the temporarily baked film Ba—Ca—Cu—O was sealed into a enclosed alumina vessel with the mixture pellet of $Tl_2O_3$, BaO, CaO and CuO (Tl:Ba:Ca:Cu=1:2:2:3). The alumina vessel was put into an electric furnace and was held at the temperature of 850° C. for 20 hours, then it was gradually cooled, and $Tl_1Ba_2Ca_2Cu_3O_y$ group superconducting film was formed on the $Y_2O_3$ single crystal plate. FIG. 1 is a schematic diagram representing the thallium group superconducting film. Measurement by X-ray diffraction has revealed that the film was a $Tl_1Ba_2Ca_2Cu_3O_y$ group superconducting film with the c-axis arranged perpendicular to (100) faces of the single crystal plate, exhibiting c-axis orientation. Furthermore, FIG. 2 shows pole figure measurement results. Peaks at intervals of 90 degrees were observed in the direction of 78 degrees with respect to (100) faces of the single crystal plate, exhibiting in-plane orientation with a- and b-axis arranged in order.

Similarly, c-axis oriented $Tl_1Ba_2Ca_2Cu_3O_y$ group superconducting film was produce by the same coating and temporary baking process and heat treatment applied to the $SrTiO_3$ single crystal plate having (100) faces. Furthermore, pole figure measurement has made it clear that this thallium group superconducting film exhibits in-plane orientation parallel to (100) faces of the single crystal plate with a- and b-axis arranged in order. This thallium group superconducting film had a critical temperature (Tc) of 106 K., and the critical current density (Jc) at 77 K. and zero magnetic field was as high as $5 \times 10^5 A/cm^2$ or more. Furthermore, when the magnetic field is applied parallel to the superconducting film surface, the film is a high quality thallium group superconducting film having a value as high as $10^5 A/cm^2$ at 77 K. in the magnetic field of 7T.

When subjected to heat treatment in a temperature range of 750 to 860° C. for 0.2 to 100 hours, it was possible to form high-quality a-, b- and c-axis oriented $Tl_1Ba_2Ca_2Cu_3O_y$, group superconducting film having Tc of 90 K. or more. Furthermore, when the number of coating and temporary baking processes to be repeated is changed from 10 to 100 times and the Ba—Ca—Cu—O temporarily baked film thickness is changed from 1 to 10 microns, it is also possible to form high-quality a-, b- and c-axis oriented $Tl_1Ba_2Ca_2Cu_3O_y$, group superconducting wire having Tc of 90 K. or more by providing the same heat treatment as above. When the $Y_2O_3$ single crystal plate having four plane facets having a diameter of 0.03 to 0.35 mm is used, it is also possible to form high-quality a-, b- and c-axis oriented $Tl_1Ba_2Ca_2Cu_3O_y$ group superconducting wire having Tc of 90K or more by providing the same heat treatment as above.

When naphthenates of Ba, Ca and Cu were blended to get a composition ratio of $Ba_2Ca_2Cu_3O_7$, and toluene was added thereto to dissolve it and to obtain starting solution, it is possible to form high-quality a-, b- and c-axis oriented $Tl_1Ba_2Ca_2Cu_3O_{10}$ group superconducting wire on the $Y_2O_3$ single crystal fiber by following the same manufacturing procedures as above, using the mixture pellet of $Tl_2O_3$, BaO, CaO and CuO (Tl:Ba:Ca:Cu=2:2:2:3) in the heat treatment step.

Furthermore, when naphthenates of Ba, Ca and Cu were blended to get a composition ratio of $Ba_2Ca_1Cu_2O_5$, and toluene was added thereto to dissolve it and to obtain starting solution, it is also possible to form high-quality a-, b- and c-axis oriented $Tl_xBa_2Ca_1Cu_2O_8$(x=1 or 2) group superconducting wire on the $Y_2O_3$ single crystal fiber by following the same manufacturing procedures as above.

Still further, when naphthenates of Ba, Ca and Cu were blended to get a composition ratio of $(Ba_{1-y}/Sr_y)_2Ca_xCu_{x+1}O_{2x+3}$ ($0 \leq y<1$, X=1, 2), and toluene was added thereto to dissolve it and to obtain starting solution, it is also possible to form high-quality a-, b- and c-axis oriented $Tl_z(Ba_{1-y}/Sr_y)_2Ca_xCU_{x+1}O_{2x+6}$(Z=1, 2, $0 \leq y<1$, X=1, 2) group superconducting wire by following the same manufacturing procedures as above. When naphthenates of Ba, Ca and Cu were blended to get a composition ratio of $(Ba_{1-y}/Sr_y)_2Ca_xCu_{x+1}O_{2x+3}$ ($0 \leq y<1$, X=1, 2), and toluene was added thereto to dissolve it and to obtain starting solution, it is also possible to form high-quality a-, b- and c-axis oriented $(Tl/Pb)_z(Ba_{1-y}/Sr_y)_2Ca_xCu_{x+1}O_{2x+6}$(z=1, 2, $0<y \leq 1$, X=1, 2) group superconducting wire by following the same manufacturing procedures as above, using the mixture pellet of $Tl_2O_3$, PbO, BaO, CaO and CuO (Tl/Pb:Ba:Ca:Cu=1: 2:2:3) in the heat treatment step.

After depositing Au film having a thickness of 3 microns by sputtering method on the $Tl_1Ba_2Ca_2Cu_3O_y$ group superconducting film obtained on the $Y_2O_3$ single crystal plate by following the same manufacturing procedures as above, powdered $SiO_2$ is applied thereon. This makes it possible to manufacture a thallium group superconducting wire having an insulated coating structure allowing electric current to escape when the superconducting film is quenched. FIG. 3 indicates a schematic cross sectional view of the thallium group superconducting wire.

Furthermore, when naphthenates of Ba, Ca and Cu were blended to get a composition ratio of $(Ba_{1-y}/Sr_y)_2Ca_xCu_{x+1}O_{2x+3}$ ($0<y \leq 1$, X=1, 2) and $(Ba_{1-y}/Sr_y)_2Ca_xCu_{x+1}O_{2x+3}$ ($0<y \leq 1$, X=1, 2), and toluene was added thereto to dissolve the mixture to obtain starting solution, the same Au film as above having a thickness of 3 microns was deposited; then powdered $SiO_2$ was applied thereon. This makes it possible to manufacture on the $Tl_z(Ba_{1-y}/Sr_y)_2Ca_xCu_{x+1}O_{2x+6}$(Z=1, 2, 0<y<1, X=1, 2) and $(Tl/Pb)_z(Ba_{1-y}/Sr_y)_2Ca_xCu_{x+1}O_{2x+6}$ (z=1, 2, $0<y \leq 1$, x =1, 2) group superconducting wire obtained on the $Y_2O_3$ single crystal fiber by the same manufacturing procedures as above, a thallium group superconducting wire having an insulated coating structure allowing electric current to escape when the superconducting film is quenched.

Still further, when Ag, Cu, Ag-Pd, Au-Pd, Ag-Mg and Au-Pd are used as conducting film on the $Tl_z(Ba_{1-y}/Sr_y)_2Ca_xCu_{x+1}O_{2x+6}$ (Z=1, 2, $0 \leq y<1$, X=1, 2 ) and $(Tl/Pb)_z(Ba_{1-y}/Sr_y)_2Ca_xCu_{x+1}O_{2x-6}$ (z=1, 2, $0<y \leq 1$, x=1, 2) group superconducting wire obtained by the above manufacturing procedures, or when FRP (glass fiber reinforced plastic) resin or oxides such as $Al_2O_3$ are used as insulating film on said conducting film, it is possible to manufacture a thallium group superconducting wire having an insulated coating structure allowing electric current to escape when the superconducting film is quenched.

Also, when 3 percent $Y_2O_3$—$ZrO_2$, MgO, $LaAlO_3$, $BaTiO_3$, $NdGaO_3$ and substance having a perovskite structure are used on the single crystal fiber, it is possible to form a high-quality a-, b- and c-axis oriented $Tl_z(Ba_{1-y}/Sr_y)_2Ca_xCu_{x+1}O_{2x+6}$ (Z=1, 2, $0 \leq y<1$, X-1, 2) and $(Tl/Pb)_z(Ba_{1-y}/Sr_y)_2Ca_xCu_{x+1}O_{2x+6}$(z=1, 2, $0<y \leq 1$, x=1, 2) group superconducting wire by the above manufacturing procedures.

When spray deposition, laser deposition or coating methods is used in place of dipping method, it is possible to form a high-quality a-, b- and c-axis oriented $Tl_z(Ba_{1-y}/Sr_y)_2Ca_xCu_{x+1}O_{2x+6}$(Z=1, 2, $0 \leq y<1$, X=1, 2) and $(Tl/Pb)_z(Ba_{1-y}/Sr_y)_2Ca_xCu_{x+1}O_{2x+6}$(z=1, 2, $0<y \leq 1$, x=1, 2) group superconducting wire by the above manufacturing procedures.

FIG. 4 indicates a cross sectional view illustrating the above-formed $Tl_z(Ba_{1-y}/Sr_y)_2Ca_xCu_{x+1}O_{2x+6}$ (Z=1, 2, $0 \leq y<1$, X=1, 2) and $(Tl/Pb)_z(Ba_{1-y}/Sr_y)_2Ca_xCu_{x+1})_{2x+6}$(z=1, 2, $0<y \leq 1$, x=1, 2) group superconducting wire which is formed into a thallium group superconducting wire having a multi-core structure suited to increased current carrying capacity and structural stability. Also, it is possible to form a thallium group superconducting multi-core wire whose superconducting properties are not reduced when the superconducting wire is made to have a multi-core structure.

Figure 5:
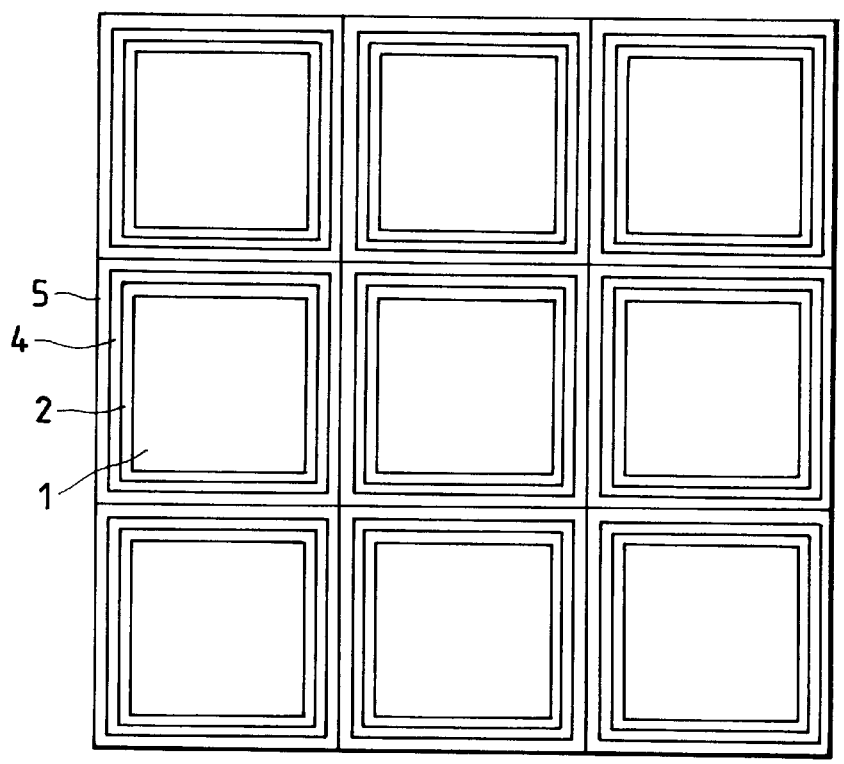
FIG. 5 is a schematic cross sectional view illustrating the thallium group superconducting multi-core wire with the coated conducting film and insulation film according to the present invention.

FIG. 5 indicates a cross sectional view illustrating a thallium group superconducting multi-core wire produced by bundling the $Tl_z(Ba_{1-y}/Sr_y)_2Ca_xCu_{x+1}O_{2x+6}$ (Z=1, 2, $0<y \leq 1$, X=1, 2) and $(Tl/Pb)_z(Ba_{1-y}/Sr_y)_2Ca_xCu_{x+1}O_{2x+6}$(z= 1, 2, $0<y \leq 1$, x =1, 2 ) group superconducting wires formed above in the order of the conducting film and insulating film on the superconducting film. Superconducting properties of the thallium group superconducting multi-core wire allow production of a thallium group superconducting multi-core wire whose superconducting properties are not reduced even when it has a multi-core structure.

Figure 6:
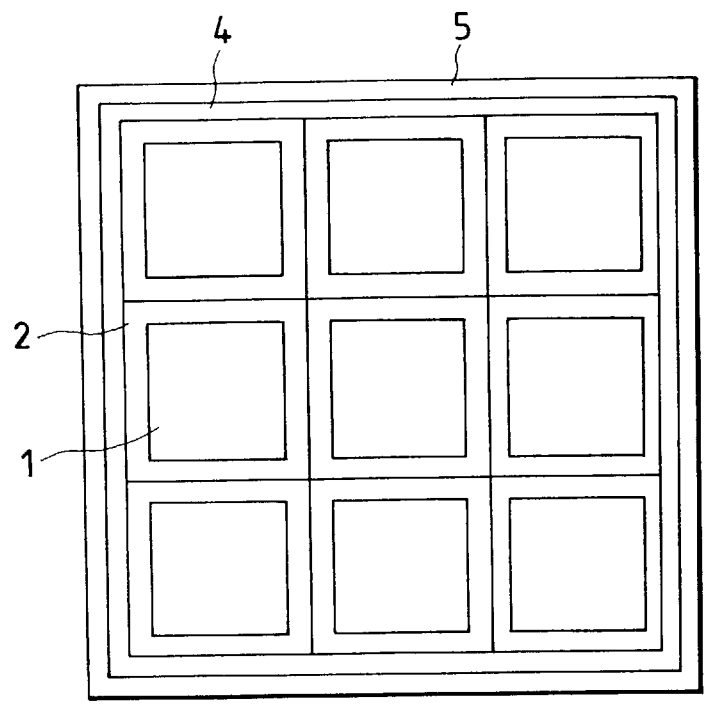
FIG. 6 is a schematic cross sectional view illustrating the thallium based superconducting multi-core wire with the conducting film and insulating film coated over the thallium group superconducting multi-core wire according to the present invention.

FIG. 6 indicates a cross sectional view illustrating a thallium group superconducting multi-core wire with the conducting film and insulating film formed in the same procedure as above, after the multi-core structure has been produced by bundling the $Tl_z(Ba_{1-y}/Sr_y)_2Ca_xCu_{x+1}O_{2x+6}$ (Z=1, 2, $0 \leq y<1$, X=1,2) and $(Tl/pb)_z(Ba_{1-y}/Sr_y)_2Ca_xCu_{x+1}O_{2x+6}$ (z=1, 2, $0<y \leq 1$, x=1, 2) group superconducting wires formed above. Superconducting properties of the thallium group superconducting multi-core wire allow production of a thallium group superconducting multi-core wire whose superconducting properties are not reduced even when it has a multi-core structure.

Figure 7:
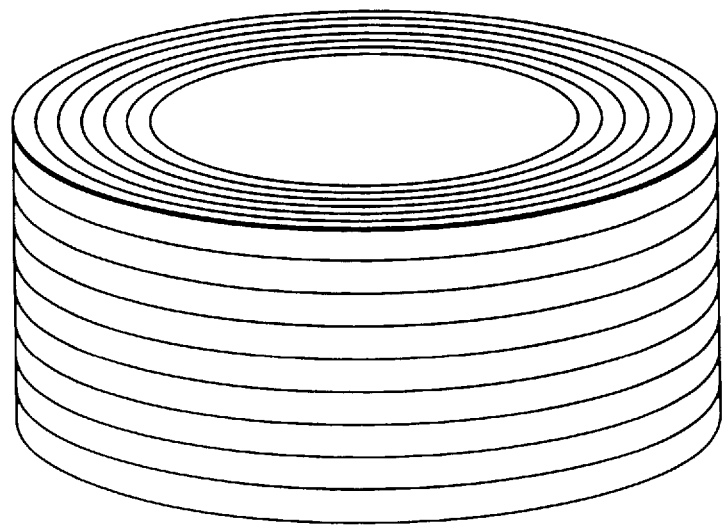
FIG. 7 is a schematic drawing illustrating a superconducting coil wound in a pan cake form according to the present invention.

FIG. 7 indicates a schematic drawing illustrating a superconducting coil produced by winding the above-formed thallium group superconducting multi-core wire in a pancake form. The superconducting coil allows magnetic field to be generated at 77K and 4.2K.

Using the oxide single crystal fiber having plane facets, the present invention allows to form thallium group superconducting film of which c-axis is oriented perpendicularly, and a- and b-axis are oriented in parallel to the longitudinal direction of the fiber. This makes it possible to produce a high quality thallium group superconducting wire with Jc of $10^5 A/cm^2$ or more at 77K. Furthermore, formation of the conducting film and insulating film in that order on the superconducting wire provides a suitable bus for electric current in the event of that the superconducting wire has been quenched. In addition, a superconducting multicore wire can be formed by bundling many of the thallium group superconducting wires, thereby ensuring large current. This allows production of a high quality superconducting magnet to be operated by the thallium group superconducting wire.

What is claimed is:

1. A thallium group superconducting wire comprising thallium group superconducting film formed on oxide single crystal fiber having facets and polygonal cross section, a conducting film on the thallium group superconducting film, and an insulating film on the conducting film, the thallium group superconducting film being made up of $Tl-(Ba_{1-y}/Sr_y)$—Ca—Cu—O, where $0<y<1$, or $(Tl/Pb)$—$(Ba_{1-y}/Sr_y)$—Ca—Cu—O, where $0<y \leq 1$, said thallium group superconducting wire having an insulated coated structure which is sufficient to allow electric current to escape when the superconducting film is quenched.

2. A thallium group superconducting wire comprising a plurality of thallium group superconducting wires according to claim 1 bundled and formed into a multi-core structure.

3. A thallium group superconducting wire comprising oxide single crystal fiber, thallium group superconducting film, conducting film, and insulating film structured in the above order when viewed from center of the wire, the thallium group superconducting film made up of $Tl$—$(Ba_{1-y}/Sr_y)$—Ca—Cu—O, where $0<y<1$, or $(Tl/Pb)$—$(Ba_{1-y}/Sr_y)$—Ca—Cu—O, where $0<y \leq 1$, said thallium group superconducting wire having an insulated coated structure which is sufficient to allow electric current to escape when the superconducting film is quenched.

4. A thallium group superconducting wire comprising a plurality of thallium group superconducting wires according to claim 3 bundled and formed into a multi-core structure.

5. A thallium group superconducting coil formed by winding the multi-core structure according to claim 4 into a coil.

6. A thallium group superconducting wire according to claim 1 or 3, wherein the oxide single crystal fiber is made up of a material selected from the group consisting of 3% $Y_2O_3$—$ZrO_2$, $Y_2O_3$, MgO, $SrTiO_3$, $LaAlO_3$, $BaTiO_3$, and $NdGaO_3$.

7. A thallium group superconducting wire according to any of claims 1 and 3, wherein the superconducting film is formed by a method selected from the group consisting of dipping method, coating method, spray deposition, and laser deposition.

8. A thallium group superconducting wire according to claim 3, wherein the conducting film is made of conducting material selected from the group consisting of Ag, Cu, Au, Ag—Pd, Au—Pd, Ag—Mg and Au—Pd.

9. A thallium group superconducting wire according to claim 3, wherein the insulating film is made of material selected from the group consisting of glass fiber reinforced plastic resin, $Al_2O_3$ and $SiO_2$.

10. A thallium group superconducting coil formed by winding the thallium group superconducting wire according to claim 3, into a coil.

11. A thallium group superconducting wire according to claim 1 or 3, wherein the oxide single crystal fiber is made of a material selected from the group consisting of $Y_2O_3$, $LaAlO_3$, $BaTiO_3$ and $NdGaO_3$.

12. A thallium group superconducting wire according to claim 1 or 3, wherein the oxide single crystal fiber has a perovskite structure.

13. A thallium group superconducting wire according to claim 1 or 3, wherein the oxide single crystal fiber is made of 3% $Y_2O_3$—$ZrO_2$.

14. A thallium group superconducting wire according to claim 1 or 3, wherein the thallium group superconducting film is made of $(Tl/Pb)$—$(Ba_{1-y}/Sr_y)$—Ca—Cu—O ($0<y \leq 1$).

15. A thallium group superconducting wire according to claim 1, wherein each of the facets contain (100) faces.

16. A thallium group superconducting wire according to claim 15, wherein the c-axis of the superconducting film is perpendicular to, and the a-axis and b-axis of the superconducting film are parallel to, the facets of the oxide single crystal fiber.

17. A thallium group superconducting wire comprising a plurality of oxide single crystal fibers, thallium group superconducting film on each of the plurality of oxide single crystal fibers, the plurality of oxide single crystal fibers having the thallium group superconducting film on each of the fibers constituting a bundle, a conducting film on the bundle, and an insulating film on the conducting film, the thallium group superconducting film being made up of $Tl$—$(Ba_{1-y}/Sr_y)$—Ca—Cu—O, where $0<y<1$, or $(Tl/Pb)$—$(Ba_{1-y}/Sr_y)$—Ca—Cu—O, where $0<y \leq 1$, the thallium group superconducting wire having an insulated coated structure which is sufficient to allow electric current to escape when the superconducting film is quenched.

18. A thallium group superconducting wire according to claim 17, wherein the conducting film is made of conducting material selected from the group consisting of Ag, Cu, Au, Ag—Pd, Au—Pd, Ag—Mg and Au—Pd.

19. A thallium group superconducting wire according to claim 17, wherein the insulating film is made of material selected from the group consisting of glass fiber reinforced plastic resin, $Al_2O_3$ and $SiO_2$.

20. A thallium group superconducting coil formed by winding the thallium group superconducting wire according to claim 17 into a coil.

* * * * *